United States Patent
Isoe et al.

(10) Patent No.: US 12,341,502 B2
(45) Date of Patent: Jun. 24, 2025

(54) DRIVER CIRCUITRY AND ELECTRONIC CIRCUITRY

(71) Applicants: Kabushiki Kaisha Toshiba, Tokyo (JP); Toshiba Electronic Devices & Storage Corporation, Tokyo (JP)

(72) Inventors: Ryo Isoe, Kawasaki Kanagawa (JP); Yuichi Goto, Hiratsuka Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 107 days.

(21) Appl. No.: 18/367,761

(22) Filed: Sep. 13, 2023

(65) Prior Publication Data

US 2024/0267046 A1    Aug. 8, 2024

(30) Foreign Application Priority Data

Feb. 2, 2023 (JP) .................................. 2023-014903

(51) Int. Cl.
| | |
|---|---|
| *H03K 17/16* | (2006.01) |
| *H03K 17/687* | (2006.01) |
| *H03K 19/003* | (2006.01) |
| *H03K 19/0948* | (2006.01) |

(52) U.S. Cl.
CPC ......... *H03K 17/161* (2013.01); *H03K 17/687* (2013.01); *H03K 19/00315* (2013.01); *H03K 19/00361* (2013.01); *H03K 19/0948* (2013.01)

(58) Field of Classification Search
CPC ............... H03K 17/161; H03K 17/687; H03K 19/00315; H03K 19/00361; H03K 19/0948
See application file for complete search history.

(56) References Cited

U.S. PATENT DOCUMENTS

| | | | |
|---|---|---|---|
| 9,716,395 B2* | 7/2017 | Kinzer | .................. H01L 25/072 |
| 9,762,048 B2 | 9/2017 | Tanaka et al. | |
| 10,396,547 B2 | 8/2019 | Kanda et al. | |
| 11,133,738 B2* | 9/2021 | Akahane | ................. H02M 1/08 |
| 2012/0091976 A1* | 4/2012 | Chen | .................... H03K 17/302 |
| | | | 323/271 |

(Continued)

FOREIGN PATENT DOCUMENTS

| | | | |
|---|---|---|---|
| JP | 2017-112703 A | 6/2017 | |
| JP | 2018-046685 A | 3/2018 | |
| JP | 2022-059436 A | 4/2022 | |

*Primary Examiner* — Patrick O Neill
(74) *Attorney, Agent, or Firm* — Kim & Stewart LLP (57) ABSTRACT

A driver circuitry includes first-fifth inverters which have lower withstand voltage, and first-sixth transistors which have higher withstand voltage. In the first transistor, a first voltage is applied to a first end, and a second end is connected to the high withstand voltage element. The second transistor is connected to the first transistor. The second inverter is connected to the first inverter and the first transistor. The third inverter is connected to the first inverter. The third transistor is connected to the second inverter. The fourth transistor is connected to the third transistor. The fifth transistor is connected to the third inverter. The sixth transistor is connected to the fifth transistor. The fourth inverter is connected to the sixth transistor and the second transistor. The fifth inverter is connected to the fourth transistor, the fourth inverter, and the fourth inverter.

9 Claims, 4 Drawing Sheets

(56) References Cited

U.S. PATENT DOCUMENTS

| | | | |
|---|---|---|---|
| 2016/0056818 A1* | 2/2016 | Kanda | H10D 62/127 |
| | | | 318/504 |
| 2016/0276933 A1* | 9/2016 | Saito | H03K 19/017509 |
| 2018/0004238 A1* | 1/2018 | Shen | G05F 1/462 |
| 2022/0109380 A1 | 4/2022 | Sakai | |

* cited by examiner

DRIVER CIRCUITRY AND ELECTRONIC CIRCUITRY

CROSS REFERENCE TO THE RELATED APPLICATIONS

This application is based upon and claims the benefit of priority from the Japanese Patent Application No. 2023-014903, filed on Feb. 2, 2023, the entire contents of which are incorporated herein by reference.

FIELD

Embodiment of the present invention relates to a driver circuitry and an electronic circuitry.

BACKGROUND

Conventionally, in a driver circuitry of a driver integrated circuit (IC) of a high withstand voltage MOSFET (Metal-Oxide-Semiconductor Field-Effect Transistor), particularly, in a high-side driver circuitry, a driver circuitry using a process of withstand voltage of 15V or more has been used to drive a MOSFET driven at 15V. On the other hand, in order to miniaturize the process, it is necessary to configure the driver circuitry using a process having a gate withstand voltage of about 5V. For this reason, a control circuit may be configured using a power supply with a low voltage of about 5V based on a high-side bootstrap voltage, for example, as a surface substrate potential on an insulating film of silicon on insulator (SOI).

However, when a low-side MOSFET at an output stage of a switching circuit transitions from on to off and then the high-side MOSFET switches to on, an output voltage rises from 0V to the power supply on the positive side, dv/dt is applied to the substrate capacitance in the high-side region, and a displacement current flows. This displacement current flows through a high-side circuit element using a 5V power supply generated inside an IC, which causes a problem that malfunction is likely to occur.

DETAILED DESCRIPTION

According to one embodiment, a driver circuitry is a circuitry that drives a high withstand voltage element having a withstand voltage higher than a first withstand voltage, and includes a first transistor, a second transistor, a third transistor, a fourth transistor, a fifth transistor, a sixth transistor, a first inverter, a second inverter, a third inverter, a fourth inverter, and a fifth inverter. The first transistor has a first end thereof to which a first voltage is applied, and a second end thereof connected to a drive terminal of the high withstand voltage element, and has a withstand voltage higher than the first withstand voltage. The second transistor has a first end thereof connected to the second end of the first transistor, and a second end thereof to which a second voltage is applied, and has a withstand voltage higher than the first withstand voltage. The first inverter to which a drive signal is input from a first end thereof is formed of an element having withstand voltage performance against a second withstand voltage lower than the first withstand voltage. The second inverter has a first end thereof connected to a second end of the first inverter, and a second end thereof connected to a drive terminal of the first transistor, and is formed of an element having withstand voltage performance against the second withstand voltage. The third inverter has a first end thereof connected to the first end of the first inverter, and is formed of an element having withstand voltage performance against the second withstand voltage. The third transistor has a first end thereof connected to the second end of the second inverter, and has a withstand voltage higher than the first withstand voltage. The fourth transistor has a first end thereof connected to the second end of the third transistor, and has a withstand voltage higher than the first withstand voltage. The fifth transistor has a first end thereof connected to a second end of the third inverter, and has a withstand voltage higher than the first withstand voltage. The sixth transistor has a first end thereof connected to a second end of the fifth transistor, and has a withstand voltage higher than the first withstand voltage. The fourth inverter has a first end thereof connected to a second end of the sixth transistor and a second end thereof connected to a drive terminal of the second transistor, and is formed of an element having withstand voltage performance against the second withstand voltage. The fifth inverter has a first end thereof connected to a second end of the fourth transistor and a second end of the fourth inverter, and a second end thereof connected to the first end of the fourth inverter, and is formed of an element having withstand voltage performance against the second withstand voltage.

Hereinafter, the embodiment will be described with reference to the drawings. The driver circuitry in the present disclosure is, for example, a driver circuitry for driving a high-side switch. In the present disclosure, the expressions "higher" and "lower" may be used, but these expressions can be respectively replaced with "greater than or equal to" and "less than or equal to" as necessary.

First Embodiment

Figure 1:
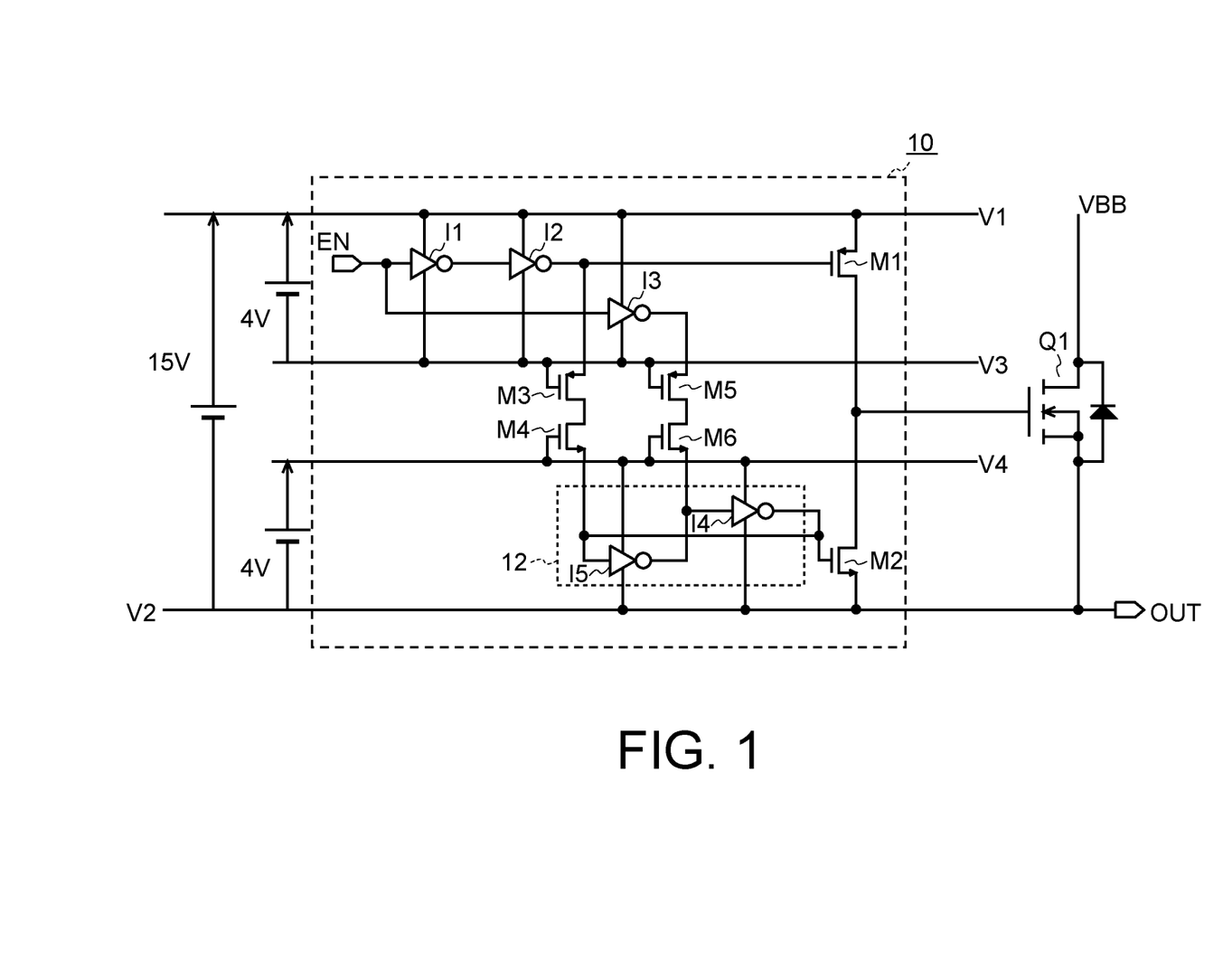
FIGS. 1 and 2 are circuit diagrams illustrating an example of a driver circuitry according to an embodiment.

FIG. 1 is a circuit diagram illustrating a driver circuitry according to an embodiment. A driver circuitry 10 is a circuitry that drives a high withstand voltage element Q1. The high withstand voltage element Q1 is, for example, an element forming a high-side switch, and is a high withstand voltage MOSFET capable of applying a gate voltage of about 15[V], such as an n-type Double-Diffused MOSFET (DMOS). The high withstand voltage element Q1 may be, for example, laterally diffused DMOS (LDMOS). The high withstand voltage element Q1 is, for example, a switch to which a voltage of about 600[V] is sometimes applied between the drain and the source. The driver circuitry 10 is a circuitry that inputs a drive signal to the gate of the high withstand voltage element Q1, and an element having withstand voltage performance lower than the withstand voltage performance of the high withstand voltage element Q1, such as 5[V], is used as a part thereof.

As an example, the high withstand voltage is set to withstand voltage performance capable of applying a voltage of about 15[V] and the low withstand voltage is set to withstand voltage performance capable of applying a voltage of about 5[V], but the withstand voltage performance is not limited thereto. Hereinafter, in the present disclosure, a withstand voltage to be a high withstand voltage is referred to as a first withstand voltage (for example, 12[V] or 15[V]), and a voltage indicating a withstand voltage that is lower than the first withstand voltage and is not a high withstand voltage is referred to as a second withstand voltage (for example, 5[V]). The high withstand voltage element is an element that can deal with a voltage higher than the first withstand voltage, and the low withstand voltage element is an element that cannot deal with the first withstand voltage but can deal with the second withstand voltage.

The driver circuitry 10 includes a plurality of transistors and a plurality of inverters. For example, the driver circuitry 10 receives a first voltage V1 and a second voltage V2 from the outside, and internally generates, in a voltage control circuit (not illustrated in detail), a third voltage V3 and a fourth voltage V4 satisfying V1>V3>V4>V2. The first voltage V1 and the third voltage V3, and the fourth voltage V4 and the second voltage V2 are controlled so as to have a potential difference lower than the second withstand voltage, for example, a potential difference of 4[V]. In particular, the second voltage V2 can be the source voltage of the high withstand voltage element Q1.

In the present disclosure, a terminal on an upper side may be referred to as a first end and a terminal on a lower side may be referred to as a second end for an element having terminals on the upper and lower sides in the drawing, and a terminal on a left side may be referred to as a first end and a terminal on a right side may be referred to as a second end for an element having terminals on the left and right sides in the drawing.

A first transistor M1 is, for example, a high withstand voltage p-type MOSFET (pMOS), the first voltage V1 is applied to the source (first end), and the drain (second end) is connected to the gate (drive terminal) of the high withstand voltage element Q1.

A second transistor M2 is, for example, a high withstand voltage n-type MOSFET (nMOS), and the drain (first end) is connected to the drain of the first transistor M1 and the gate of the high withstand voltage element Q1, and the source (second end) is connected to the source of the high withstand voltage element Q1, and is applied by the second voltage V2.

An appropriate resistor may be connected between the first transistor M1 and the second transistor M2 as necessary. These transistors form a complementary MOSFET (CMOS), and output a drive signal of the high withstand voltage element Q1 from a shared drain based on voltages applied to the gates. The first transistor M1 and the second transistor M2 may be DMOS.

An enable signal for driving the high withstand voltage element Q1 is input to a first inverter I1. The enable signal is input to the first inverter I1 from an input (first end) side, and an output (second end) is connected to an input of a second inverter I2.

The second inverter I2 has the input (first end) connected to the output of the first inverter I1 and an output (second end) connected to the gate of the first transistor M1.

An input (first end) of a third inverter I3 is connected to the input of the first inverter I1.

In each of the first inverter I1, the second inverter I2, and the third inverter I3, the positive-side reference voltage is the first voltage V1, and the negative-side reference voltage is the third voltage V3. In other words, the first voltage V1 is applied to the positive-side electrode of each inverter, and the third voltage V3 is applied to the negative-side electrode. These inverters may be any elements that can withstand the potential difference between the first voltage V1 and the third voltage V3, and can each be formed using a low withstand voltage element. As an example of FIG. 1, the elements forming these inverters may not have withstand voltage performance against the first withstand voltage, but may have withstand voltage performance against the second withstand voltage. For example, in a case where the second withstand voltage is set to 5[V], it is possible to safely perform the operation of the low withstand voltage element in the driver circuitry 10 by applying a voltage of 4[V] as illustrated in the drawing.

The signals output from the second inverter I2 and the third inverter I3 are level-shifted and input to a latch circuit 12. A level shift circuit is formed by a third transistor M3, a fourth transistor M4, a fifth transistor M5, and a sixth transistor M6 which are high withstand voltage elements.

The third transistor M3 is, for example, a p-type MOSFET. In the third transistor M3, the source (first end) thereof is connected to the output of the second inverter I2, the drain (second end) thereof is connected to the drain of the fourth transistor M4, and the third voltage V3 is applied to the gate (drive terminal) thereof.

The fourth transistor M4 is, for example, an n-type MOSFET. In the fourth transistor M4, the drain (first end) thereof is connected to the drain of the third transistor M3, the source (second end) thereof is connected to the latch circuit 12, and the fourth voltage V4 is applied to the gate (drive terminal) thereof.

The signal output from the second inverter I2 is input to the source of the third transistor M3 as a signal with the third voltage V3 as a negative-side reference voltage. This signal is output from the drain of the third transistor M3 to the drain of the fourth transistor M4. The signal is output from the source of the fourth transistor M4 to the latch circuit 12 with the fourth voltage V4 as a positive-side reference voltage. The fourth transistor M4 outputs a signal in a range of a voltage lower than the fourth voltage V4 applied from the source to the gate. Therefore, a signal in which the power supply voltage on the positive side is based on the fourth voltage V4 is output from the fourth transistor M4.

More specifically, in a case where the third voltage V3 is applied to the gate of the third transistor M3 and a signal of High with reference to the third voltage V3 being the negative-side reference voltage is input to the source, the voltage between the source and the gate exceeds a predetermined value, and the drain current flows. When a signal of Low with reference to the third voltage V3 is input to the source of the third transistor M3, the voltage between the source and the gate is less than the predetermined value, so that the drain current does not flow through the third transistor M3. As described above, in the third transistor M3, the drain current does not flow when the signal of Low in a case where the negative-side reference voltage is the third voltage V3 is input to the source, and the drain current flows when the signal of High is input to the source.

When the fourth voltage V4 is applied to the gate of the fourth transistor M4, and the drain current of the third transistor M3 increases the potential of the drain to increase the voltage between the drain and the source, a drain current corresponding to the fourth voltage V4 flows. As a result, a signal of High/Low corresponding to the fourth voltage V4 according to the High/Low of the drain, that is, a signal in which the reference value of the positive-side voltage is set to the fourth voltage V4 is output from the source of the fourth transistor M4. In the latch circuit 12, High/Low determination is made based on the voltage based on the output signal.

The fifth transistor M5 is, for example, a p-type MOSFET. In the fifth transistor M5, the source (first end) thereof is connected to the output of the third inverter I3, the drain (second end) thereof is connected to the drain of the sixth transistor M6, and the third voltage V3 is applied to the gate (drive terminal) thereof.

The sixth transistor M6 is, for example, an n-type MOSFET. In the sixth transistor M6, the drain (first end) thereof is connected to the drain of the fifth transistor M5, the source (second end) thereof is connected to the latch circuit 12, and the fourth voltage V4 is applied to the gate (drive terminal) thereof.

The signal output from the third inverter I3 is input to the source of the fifth transistor M5 as a signal in which the third voltage V3 is set as a negative-side reference voltage. This signal is output from the drain of the fifth transistor M5 to the drain of the sixth transistor M6. Then, the signal is output from the source of the sixth transistor M6 to the latch circuit 12 with the fourth voltage V4 as a positive-side reference voltage. The operations of the fifth transistor M5 and the sixth transistor M6 are similar to the operations of the third transistor M3 and the fourth transistor M4 described above.

The third transistor M3, the fourth transistor M4, the fifth transistor M5, and the sixth transistor M6 may each be, for example, a DMOS. In addition, these transistors may be, for example, transistors having withstand voltage performance against the first withstand voltage.

The latch circuit 12 includes, for example, a fourth inverter I4 and a fifth inverter I5. If necessary, a resistor may be provided in the connection path between the fourth inverter I4 and the fifth inverter I5.

The fourth inverter I4 has an input (first end) connected to the source of the sixth transistor M6, and an output (second end) connected to the gate of the second transistor M2 and the input of the fifth inverter 15.

The fifth inverter I5 has an input (first end) connected to the source of the fourth transistor M4 and an output (second end) connected to the input of the fourth inverter I4.

With the above connection, an RS latch that resets the input of the fourth inverter I4 and resets the input of the fifth inverter I5 is formed as the latch circuit 12. When a signal of Low is input to the fourth inverter 14 and a signal of High is input to the fifth inverter I5, a signal of High is input to the gate of the second transistor M2. When a signal of High is input to the fourth inverter I4 and a signal of Low is input to the fifth inverter I5, a signal of Low is input to the gate of the second transistor M2.

In other words, when a signal of High is output from the fourth transistor M4 and a signal of Low is output from the sixth transistor M6, a signal of High is input to the second transistor M2. Conversely, when a signal of Low is output from the fourth transistor M4 and a signal of High is output from the sixth transistor M6, a signal of Low is input to the second transistor M2.

In each of the fourth inverter I4 and the fifth inverter I5, the positive-side reference voltage is the fourth voltage V4, and the negative-side reference voltage is the second voltage V2. In other words, the fourth voltage V4 is applied to the positive-side electrode of each inverter, and the second voltage V2 is applied to the negative-side electrode of each inverter. These inverters may each be an element that can withstand a potential difference between the fourth voltage V4 and the second voltage V2, for example, 4[V] lower than the second withstand voltage, that is, an element having withstand voltage performance against the second withstand voltage, and can be formed using a low withstand voltage element.

When the enable signal is High, the first inverter I1 outputs a signal of Low, and the second inverter I2 outputs a signal of High. As a result, a signal of High in which the positive-side reference voltage is the first voltage V1 and the negative-side reference voltage is the third voltage V3 is applied to the gate of the first transistor M1.

In addition, the third inverter I3 outputs a signal of Low, the fourth inverter I4 outputs a level-shifted signal of High via the level shift circuit formed by the third transistors M3 to the sixth transistor M6, and the fifth inverter I5 outputs a level-shifted signal of Low. As a result, a signal of High in which the positive-side reference voltage is the fourth voltage V4 and the negative-side reference voltage is the second voltage V2 is applied to the gate of the second transistor M2.

Depending on the application state of the signal, the first transistor M1 is turned off and the second transistor M2 is turned on, so that a signal of Low based on the first voltage V1 and the second voltage V2 is applied to the gate of the high withstand voltage element Q1.

In a case where the enable signal is Low, the operation opposite to the above is performed, and the first transistor M1 is turned on and the second transistor M2 is turned off, so that a signal of High based on the first voltage V1 and the second voltage V2 is applied to the gate of the high withstand voltage element Q1.

As described above, according to the present embodiment, it is possible to drive the high withstand voltage element Q1 having a drain withstand voltage of 15[V] by using an element having withstand voltage performance with respect to the second withstand voltage (for example, 5[V]). The driver circuitry 10 can appropriately turn on and off the switch based on the source potential (corresponding to the second voltage V2) of the high withstand voltage element Q1 which is a high-side switch. Therefore, it is possible to reduce the influence of the displacement current caused by the external load connected to the output terminal OUT on the driver circuitry 10 even at the timing when the high-side switch transitions between on and off.

Therefore, it is possible to form a driver circuitry using a low withstand voltage element. By forming a driver using a low withstand voltage element, the chip size can be reduced. Also in the process, the process of generating the element of each inverter can be realized by a process of forming a low withstand voltage element. In addition, it is possible to configure a driver circuitry of a power device using a power supply with a low voltage of up to about 5[V] which is the surface substrate potential on the insulating film of SOI.

Figure 2:
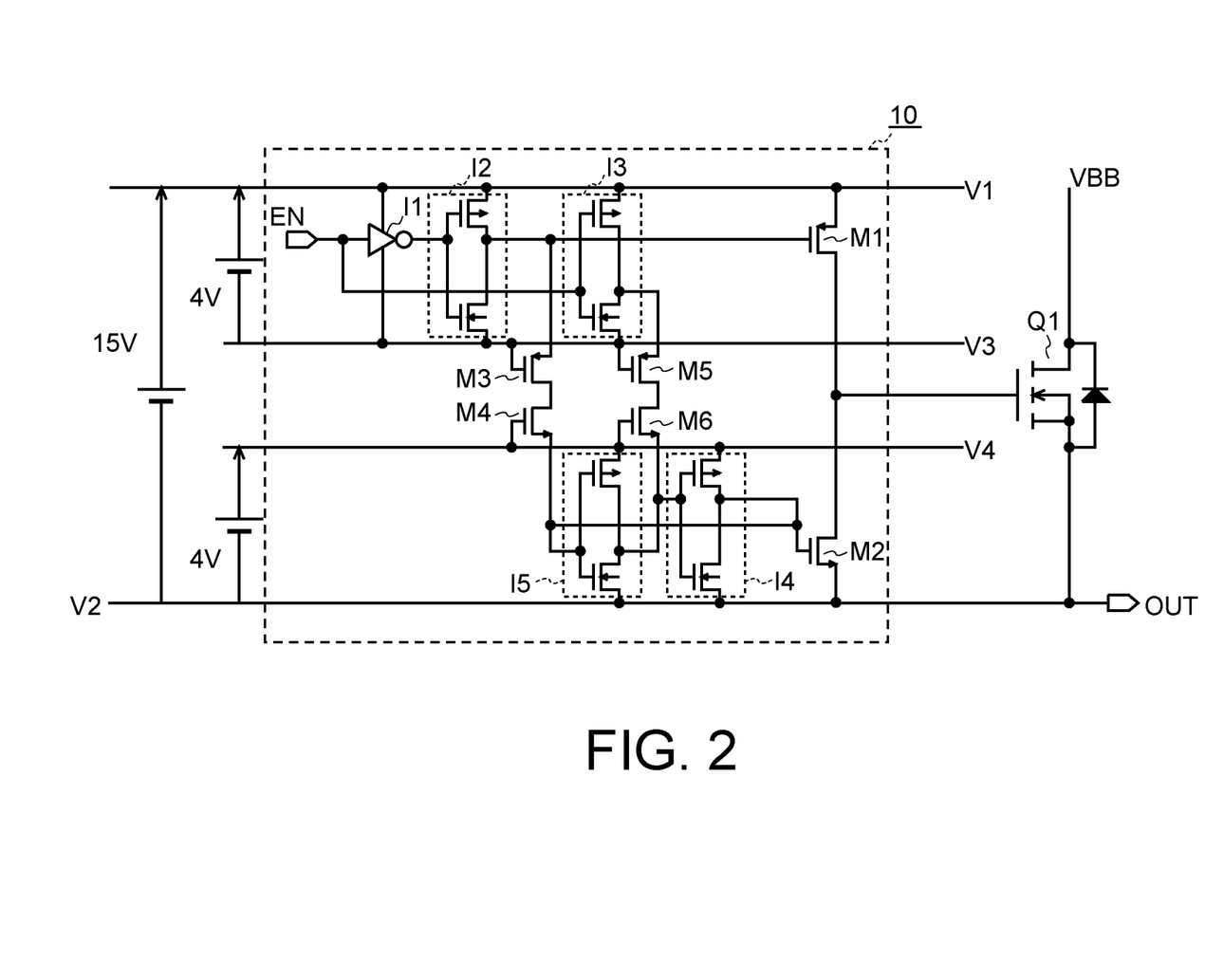

FIG. 2 is a diagram illustrating a mode in which a CMOS is used as an example of the second inverter I2, the third inverter I3, the fourth inverter I4, and the fifth inverter I5 in FIG. 1.

As illustrated in the drawing, the inverter may be formed by CMOS. Regarding the voltage applied between each source and drain of the CMOS, each element (CMOS) may have the gate withstand voltage which has the withstand voltage performance with respect to the second withstand voltage (for example, 5[V]). In addition, the first inverter I1 can also have a configuration similar to that of the second inverter I2 or the third inverter I3.

Second Embodiment

The high withstand voltage element Q1 and the driver circuitry 10 according to the above-described embodiment can be used as a single high-side switch in which a load is simply provided on the opposite side of the switch with respect to the power supply, but can also be used in combination with a low-side switch.

Figure 3:
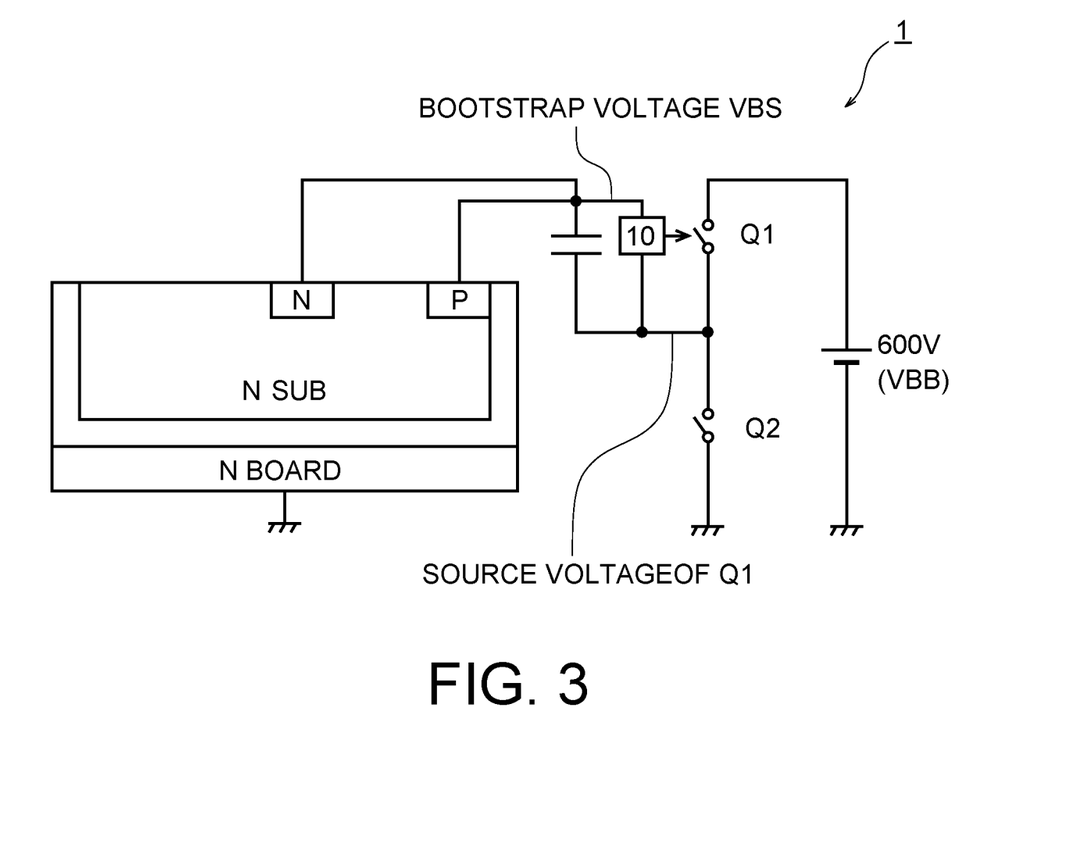
FIGS. 3 and 4 are circuit diagrams illustrating a usage example of the driver circuitry according to the embodiment.

FIG. 3 is a diagram illustrating an example of an electronic circuitry including a high-side switch and a driver circuitry 10 according to an embodiment.

An electronic circuitry 1 is, for example, a circuitry that operates by controlling a voltage applied from a voltage source VBB of 600[V] by a first high withstand voltage element Q1 that is a high-side switch and a second high withstand voltage element Q2 that is a low-side switch. The semiconductor on the left side of the drawing is described as an example, and can be an arbitrary circuit to control a voltage as a high-side switch.

The high-side switch corresponds to the high withstand voltage element Q1 in FIGS. 1 and 2. The high-side switch is driven by the signal output from the driver circuitry 10 described above.

The bootstrap voltage VBS is input to the driver circuitry 10 as the first voltage V1, and the source voltage of the first high withstand voltage element Q1, which is the high-side switch, is input thereto as the second voltage V2.

By connecting the driver circuitry 10 in this manner, even when the potential (second voltage V2) of the first high withstand voltage element Q1 rapidly changes, the first voltage V1 is appropriately controlled by the bootstrap voltage VBS, so that the influence of the displacement current on the transistors forming the inverters in the driver circuitry 10 can be reduced.

By setting the first voltage V1 to the bootstrap voltage VBS and setting the second voltage V2 to the source voltage, for example, even in a case where the second high withstand voltage element Q2 transitions from on to off, and then the first high withstand voltage element Q1 transitions from off to on to apply a voltage of about 600[V] to an external load, the difference between the power supply voltages of the driver circuitry 10 before and after the transition does not greatly fluctuate, and for example, can be maintained at 15[V] as illustrated in FIG. 1.

Third Embodiment

In the second embodiment, the case where the low-side switch is disposed has been described, but the driver circuitry of the low-side switch can also be a circuit similar to the driver circuitry 10.

Figure 4:
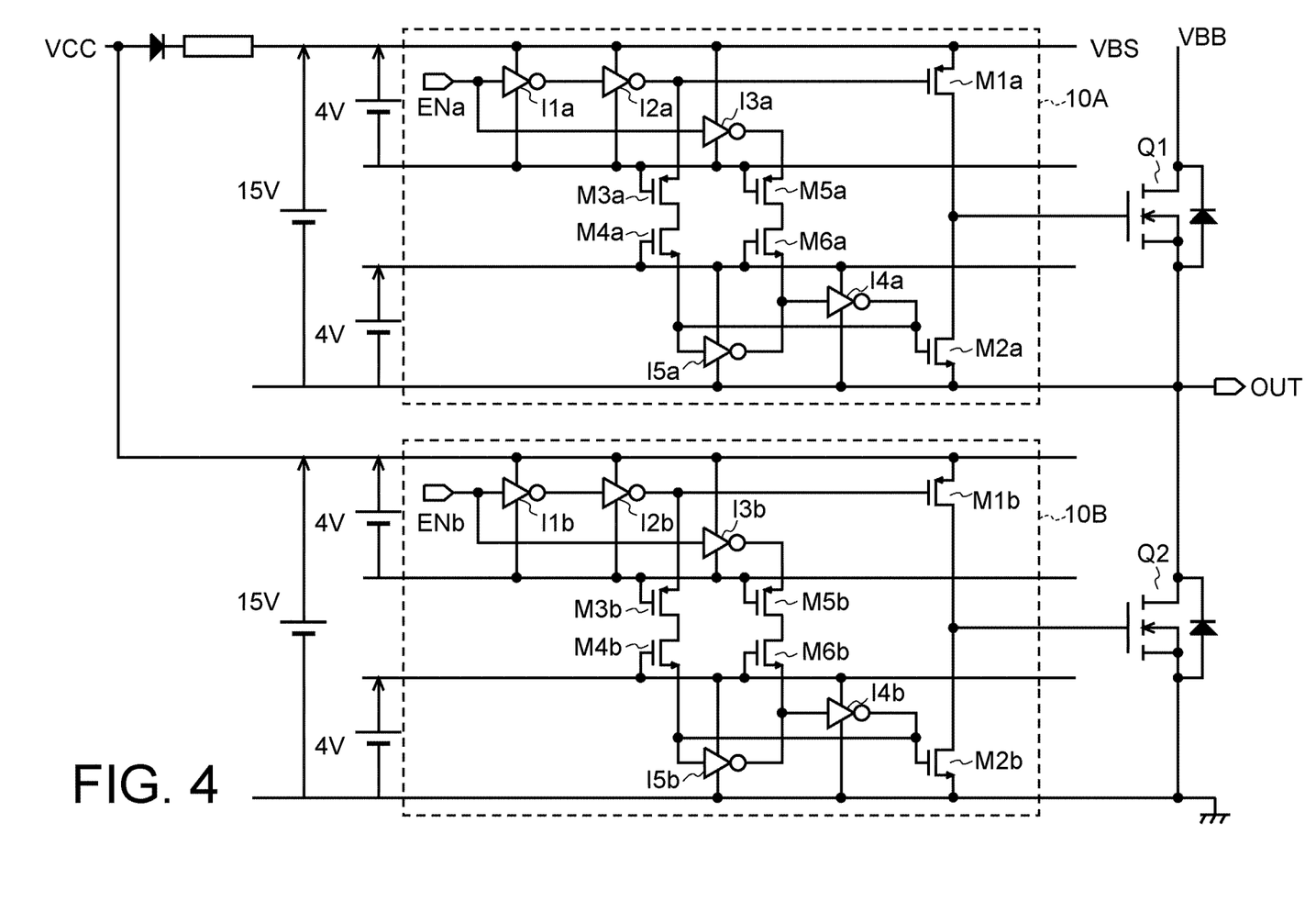

FIG. 4 is a diagram illustrating an example of a switch including a high-side switch and a low-side switch according to an embodiment.

A driver circuitry 10A for driving a first high withstand voltage element Q1, which is a high-side switch, and a driver circuitry 10B for driving a second high withstand voltage element Q2, which is a low-side switch, are connected as illustrated in the drawing. The driver circuitry 10A and the driver circuitry 10B can have the same configuration. The symbol "a" assigned to an element constituting each of the driver circuitry indicates that the element is an element of the high-side driver circuitry 10A, and the symbol "b" indicates that the element is an element of the low-side driver circuitry 10B.

Similar to the above-described embodiment, the driver circuitry 10A is connected as a circuitry connected to a reference voltage in which the first voltage is the bootstrap voltage VBS and the second voltage is the source voltage of the high-side switch. In addition, as the first voltage, the bootstrap voltage VBS is connected to the power supply voltage VCC via a diode and a resistor so as to secure a voltage for driving the switch. With this connection, the block of the high-side switch can reduce the influence of the displacement current similarly to the above-described embodiment.

The driver circuitry 10B is connected such that the first voltage is the power supply voltage VCC and the second voltage is the source potential of the low-side switch, for example, the ground potential. The driver circuitry 10B of the low-side switch can realize the same operation as the driver circuitry 10A of the high-side switch by appropriately setting the power supply voltage VCC.

The driver circuitry described in each of the above-described embodiments can be analyzed by, for example, circuit pattern analysis of a chip surface or a means such as an optical microscope or an electron microscope.

The switch described in each of the above-described embodiments can be applied to, for example, a power device such as an inverter in a home appliance such as an air conditioner or other equipment requiring a high voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A driver circuitry that is a circuitry for driving a high withstand voltage element having withstand voltage performance against a first withstand voltage, the driver circuitry comprising:
 a first transistor in which a first voltage is applied to a first end thereof, and a second end thereof is connected to a drive terminal of the high withstand voltage element, and which is a p-channel Metal-Oxide-Semiconductor Field-Effect Transistor (pMOS) having withstand voltage performance against the first withstand voltage;
 a second transistor in which a first end thereof is connected to the second end of the first transistor, and a second voltage is applied to a second end thereof, and which is an n-channel MOSFET (nMOS) having withstand voltage performance against the first withstand voltage;
 a first inverter to which a drive signal is input from a first end thereof, and which is formed of an element having withstand voltage performance against a second withstand voltage lower than the first withstand voltage;
 a second inverter in which a first end thereof is connected to the second end of the first inverter, and a second end thereof is connected to a drive terminal of the first transistor, and which is formed of an element having withstand voltage performance against the second withstand voltage;
 a third inverter in which a first end thereof is connected to the first end of the first inverter, and which is formed of an element having withstand voltage performance against the second withstand voltage;
 a third transistor in which a first end thereof is connected to the second end of the second inverter, and which is a pMOS having withstand voltage performance against the first withstand voltage;

a fourth transistor in which a first end thereof is connected to a second end of the third transistor, and which is an nMOS having withstand voltage performance against the first withstand voltage;

a fifth transistor in which a first end thereof is connected to a second end of the third inverter, and which is a pMOS having withstand voltage performance against the first withstand voltage;

a sixth transistor in which a first end thereof is connected to a second end of the fifth transistor, and which is an nMOS having withstand voltage performance against the first withstand voltage;

a fourth inverter in which a first end thereof is connected to a second end of the sixth transistor, and a second end thereof is connected to a drive terminal of the second transistor, and which is formed of an element having withstand voltage performance against the second withstand voltage; and a fifth inverter in which a first end thereof is connected to a second end of the fourth transistor and the second end of the fourth inverter, and a second end thereof is connected to the first end of the fourth inverter, and which is formed of an element having withstand voltage performance against the second withstand voltage.

2. The driver circuitry according to claim 1, wherein
the first voltage is applied to a positive-side electrode of each of the first inverter, the second inverter, and the third inverter, and a third voltage higher than the second voltage is applied to a negative-side electrode of each of the first inverter, the second inverter, and the third inverter, a fourth voltage higher than the second voltage and lower than the third voltage is applied to a positive-side electrode of each of the fourth inverter and the fifth inverter, and the second voltage is applied to a negative-side electrode of each of the fourth inverter and the fifth inverter, and the third voltage is applied to a drive terminal of each of the third transistor and the fifth transistor, and the fourth voltage is applied to a drive terminal of each of the fourth transistor and the sixth transistor.

3. The driver circuitry according to claim 2, wherein
the second voltage is a voltage at an output terminal of the high withstand voltage element.

4. The driver circuitry according to claim 3, wherein
each of the first inverter, the second inverter, the third inverter, the fourth inverter, and the fifth inverter is formed of a complementary MOSFET (CMOS), and each of transistors forming the CMOS is an element having withstand voltage performance against the second withstand voltage.

5. The driver circuitry according to claim 1, wherein
the high withstand voltage element is a high-side switch.

6. An electronic circuitry comprising:
a first driver circuitry that is the driver circuitry according to claim 1;
a first high withstand voltage element that is the high withstand voltage element driven by the first driver circuitry and forms a high-side switch; and
a second high withstand voltage element that is a low-side switch.

7. The electronic circuitry according to claim 6, wherein
the first voltage is a bootstrap voltage.

8. An electronic circuitry comprising:
a first driver circuitry that is the driver circuitry according to claim 1;
a first high withstand voltage element that is the high withstand voltage element driven by the first driver circuitry and forms a high-side switch;
a second driver circuitry that is the driver circuitry according to claim 1; and
a second high withstand voltage element that is the high withstand voltage element driven by the second driver circuitry and forms a low-side switch.

9. The electronic circuitry according to claim 8, wherein
the first voltage of the first driver circuitry is a bootstrap voltage.

* * * * *